US012669530B2

(12) United States Patent
Yehezkely et al.

(10) Patent No.: US 12,669,530 B2
(45) Date of Patent: Jun. 30, 2026

(54) TECHNIQUES FOR MEASURING RADIATION PATTERNS OF HARVESTER ANTENNAS

(71) Applicant: Wiliot, Ltd., Caesarea (IL)

(72) Inventors: Alon Yehezkely, Haifa (IL); Dmitry Bravshtein, Tzofim (IL)

(73) Assignee: Wiliot, Ltd., Caesarea (IL)

( * ) Notice: Subject to any disclaimer, the term of this patent is extended or adjusted under 35 U.S.C. 154(b) by 270 days.

(21) Appl. No.: 18/514,420

(22) Filed: Nov. 20, 2023

(65) Prior Publication Data

US 2024/0168073 A1 May 23, 2024

Related U.S. Application Data

(60) Provisional application No. 63/384,501, filed on Nov. 21, 2022.

(51) Int. Cl.
G01R 29/10 (2006.01)
G01R 29/08 (2006.01)

(52) U.S. Cl.
CPC ......... G01R 29/10 (2013.01); G01R 29/0892 (2013.01)

(58) Field of Classification Search
CPC .............................. G01R 29/10; G01R 29/0892
USPC ........................................................ 324/612
See application file for complete search history.

(56) References Cited

U.S. PATENT DOCUMENTS

| | | | | |
|---|---|---|---|---|
| 4,884,078 A | * | 11/1989 | Fishkin | G01R 29/10 |
| | | | | 342/174 |
| 9,893,819 B1 | * | 2/2018 | Lee | H04B 17/102 |
| 2017/0279544 A1 | * | 9/2017 | Noda | H04B 17/102 |
| 2018/0088162 A1 | * | 3/2018 | Ndip | G01R 29/10 |
| 2018/0262279 A1 | * | 9/2018 | Bartko | H04B 17/12 |

OTHER PUBLICATIONS

Bakytbekov, Azamat. "Synergistic Multi-Source Ambient Radio Frequency and Thermal Energy Harvesting for IoT Applications." (2022). (Year: 2022).*

* cited by examiner

*Primary Examiner* — Christopher P Mcandrew
(74) *Attorney, Agent, or Firm* — M&B IP Analysts, LLC

(57) ABSTRACT

A method and system for measuring an antenna radiation pattern of a harvester antenna printed on a substrate of an Internet of Things (IoT) tag are disclosed. The method includes sweeping a power level of a source radio frequency (RF) signal transmitted at a particular direction, wherein the source RF signal is received by the harvester antenna; measuring a transmission rate of signals transmitted by the IoT tag, wherein the transmission rate is proportional to the power level of a source RF signal received by the harvester antenna; determining if the measured transmission rate is substantially equal to a predefined threshold; registering, at each measured direction, a power level of a signal reaching a transmission rate is substantially equal to the predefined threshold; and plotting the antenna radiation pattern based on the registered power levels.

18 Claims, 7 Drawing Sheets

300

Receive a source radio frequency (RF) signal — S310

Measure a transmission rate of signals transmitted by the IoT tag — S320

Determine if the measured transmission rate is substantially equal to a predefined threshold — S330

Compute the directivity of the antenna — S340

Generate the radiation pattern — S350

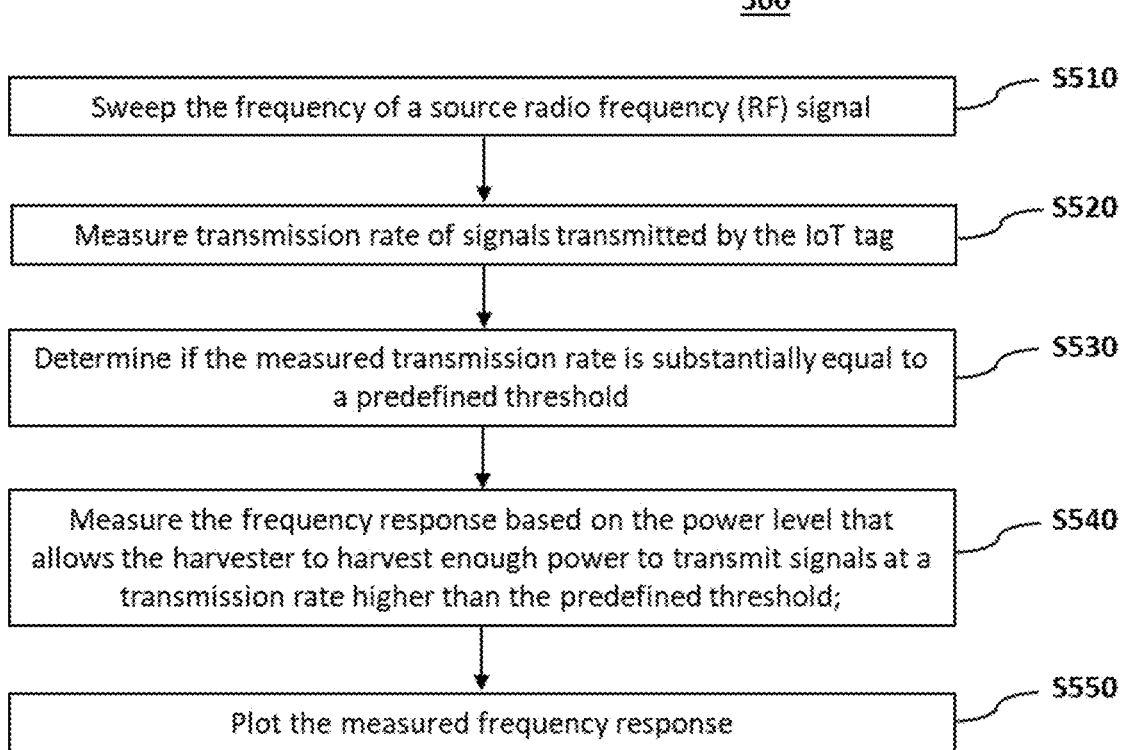

500

Sweep the frequency of a source radio frequency (RF) signal — S510

Measure transmission rate of signals transmitted by the IoT tag — S520

Determine if the measured transmission rate is substantially equal to a predefined threshold — S530

Measure the frequency response based on the power level that allows the harvester to harvest enough power to transmit signals at a transmission rate higher than the predefined threshold; — S540

Plot the measured frequency response — S550

FIG. 5

TECHNIQUES FOR MEASURING RADIATION PATTERNS OF HARVESTER ANTENNAS

CROSS-REFERENCE TO RELATED APPLICATIONS

This application claims the benefit of U.S. Provisional Application No. 63/384,501 filed Nov. 21, 2022, the contents of which are hereby incorporated by reference.

TECHNICAL FIELD

The present disclosure generally relates to energy harvesting and, more specifically, to measuring radiation patterns of harvester antennas.

BACKGROUND

The Internet of Things (IoT) is the inter-networking of physical devices, vehicles, buildings, and other items embedded with electronics, software, sensors, actuators, and network connectivity that enable these objects to collect and exchange data. IoT is expected to offer advanced connectivity of devices, systems, and services that go beyond machine-to-machine (M2M) communications and cover a variety of protocols, domains, and applications.

Most IoT devices are wireless devices that collect data and transmit such data to a central controller. A few requirements should be met to allow the widespread deployment of IoT devices or tags. Such requirements include reliable communication links, low energy consumption, and low maintenance costs.

An alternative to batteries is the power that may be harvested from sources such as light, movement, and electromagnetic power, such as existing radio frequency transmissions. The harvested power is stored in a capacitor or a rechargeable battery and is typically managed by a power management unit (PMU).

One of the challenges of designing an energy harvester for IoT tags is ambient energy availability and the harvester's physical size. Further, harvesting from radio signals requires an optimized antenna to receive low-power signals transmitted at a specific frequency band. For example, radio signals can be harvested from frequency modulation (FM), Wi-Fi, cellular, Bluetooth Low Energy (BLE) signals, and the like.

A critical element of a harvester is the antenna. The antenna design requires a minimum power loss, perfect matching to the harvester's circuit, and a small form factor to be included in an IoT device having a size of, for example, a U.S. quarter coin.

Antenna performance metrics, such as antenna pattern measurements, are often measured by a direct stand-alone connection to the antenna. The antenna pattern is achieved by rotating the device under test (DUT) with repeated measurements. The antenna interfacing circuitry is included in such measurements to model the interference of the measuring system with the antenna behavior. The interfacing circuitry is a crucial part of the measurement as the interfacing circuitry impacts the antenna's frequency or how the antenna operates, for example, in steerable antenna arrays.

Standard commercial radios include the transmit and receive functions, which can be accessed digitally to facilitate the test. The measurements are designed so that the connectors to the DUT do not impact the measured antenna.

Scattering-based measurements are used for RFID tags, where an incident signal is reflected to and from the DUT simultaneously. Unique test modes are needed for antenna pattern measurements (e.g., constant tone transmission) in such configurations.

The available solutions for measuring antenna radiation patterns are not applicable to harvester antennas. In a harvester, the harvested energy is stored in a capacitor, and it continues to operate based on the incident energy's availability.

These operations typically culminate with a transmitted packet. However, the transmit antennas and harvester antennas are typically separate in IoT tags. Therefore, transmission by the harvester antenna is not possible. Further, IoT tags typically do not include internal harvested signal strength indicators of satisfactory accuracy, which can be read and used. Attempting to connect directly to the harvester antenna will impact the performance since it is tightly designed with the harvest circuity and its frequency response.

It would, therefore, be advantageous to provide a solution for measuring the radiation pattern of a harvester antenna.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the terms "some embodiments" or "certain embodiments" may be used herein to refer to a single embodiment or multiple embodiments of the disclosure.

In one general aspect, disclosed embodiments may include a method for measuring an antenna radiation pattern of a harvester antenna printed on a substrate of an Internet of Things (IoT) tag, having: sweeping a power level of a source radio frequency (RF) signal transmitted at a particular direction, where the source RF signal is received by the harvester antenna; measuring a transmission rate of signals transmitted by the IoT tag, where the transmission rate is proportional to the power level of a source RF signal received by the harvester antenna; determining if the measured transmission rate is substantially equal to a predefined threshold; registering, at each measured direction, a power level of a signal reaching a transmission rate that is substantially equal to the predefined threshold; and plotting the antenna radiation pattern based on the registered power levels. Other embodiments of this aspect include corresponding computer systems, apparatuses, and computer programs recorded on one or more computer storage devices, each configured to perform the actions of the methods.

Implementations may include one or more of the following features. Method may include: repeating the process for each direction for which the radiation pattern is required. In some embodiments of the method, the source radio signal is transmitted by a radio power amplifier. In some embodiments of the method, the transmission rate is measured by any one of: a radio power meter and a spectrum analyzer. In some embodiments, the method is performed by a controller configured to control the radio power amplifier and the radio power meter. The method may include: computing, using registered power levels, directivity of the harvester antenna. In some embodiments of the method, the harvester is printed on the same substrate of the IoT tag. In some embodiments of the method, a frequency band of the source RF signal is any one of: a BLE band, a Wi-Fi band, a cellular band, an ISM band, a Sub-1 GHZ, and an FM radio band. Implementations of the described techniques may include hardware, a method or process, or a computer tangible medium.

In one general aspect, the method may include measuring a frequency response of a harvester antenna printed on a substrate of an Internet of Things (IoT) tag, having: sweeping a frequency of a source radio frequency (RF) signal, where the source RF signal is received at the harvester antenna; measuring a transmission rate of signals transmitted by the IoT tag, where the transmission rate is proportional to a power of a source RF signal received by the harvester antenna; determining if the measured transmission rate is substantially equal to a predefined threshold; and setting the frequency response based on frequencies that allowed the harvester to harvest enough power to transmit signals at the transmission rate that is substantially equal to the predefined threshold. Other embodiments of this aspect include corresponding computer systems, apparatuses, and computer programs recorded on one or more computer storage devices, each configured to perform the actions of the methods.

Implementations may include one or more of the following features. Method may include: adjusting the power level of the source RF signal until the measured transmission rate is substantially equal to the predefined threshold.

In one general aspect, system may include measuring an antenna radiation pattern of a harvester antenna, printed on a substrate of an Internet of Things (IoT) tag, having: a radio power amplifier configured to transmit source radio frequency (RF) signals at various directions, where the transmitted source RF signals are received by the harvester antenna, where the harvester antenna of an IoT tag is a device under test (DUT); a radio power meter for receiving signals transmitted by the IoT tag; and a controller configured to control the radio power amplifier and the radio power meter, where the controller is further configured to: sweep a power level of a source radio frequency (RF) signal transmitted at a particular direction, where the source RF signal is received by the harvester antenna; measure a transmission rate of signals transmitted by the IoT tag, where the transmission rate is proportional to the power level of a source RF signal received by the harvester antenna; determine if the measured transmission rate is substantially equal to a predefined threshold; register, at each measured direction, a power level of a signal reaching a transmission rate that is substantially equal to the predefined threshold; and plot the antenna radiation pattern based on the registered power levels. Other embodiments of this aspect include corresponding computer systems, apparatuses, and computer programs recorded on one or more computer storage devices, each configured to perform the actions of the methods.

Implementations may include one or more of the following features. In some embodiments of the system the controller is configured to: repeat the process for each direction for which the radiation pattern is required. In some embodiments of system controller is configured to: compute, using registered power levels, directivity of the harvester antenna.

In one general aspect, system may include measuring a frequency response of a harvester antenna printed on a substrate of an Internet of Things (IoT) tag, having: a radio power amplifier configured to transmit source radio frequency (RF) signals at various directions, where the transmitted source RF signals are received by the harvester antenna, where the harvester antenna of an IoT tag is a device under test (DUT); a radio power meter for receiving signals transmitted by the IoT tag; and a controller configured to control the radio power amplifier and the radio power meter, where the controller is further configured to: sweep a frequency of a source radio frequency (RF) signal, where the source RF signal is received at the harvester antenna; measure a transmission rate of signals transmitted by the IoT tag, where the transmission rate is proportional to a power of a source RF signal received by the harvester antenna; determine if the measured transmission rate is substantially equal to a predefined threshold; set the frequency response based on frequencies that allowed the harvester to harvest enough power to transmit signals at the transmission rate that is substantially equal to the predefined threshold.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

FIG. 5 is a flowchart of an example method for measuring the frequency response of a harvester antenna.

DETAILED DESCRIPTION

Figure 1:
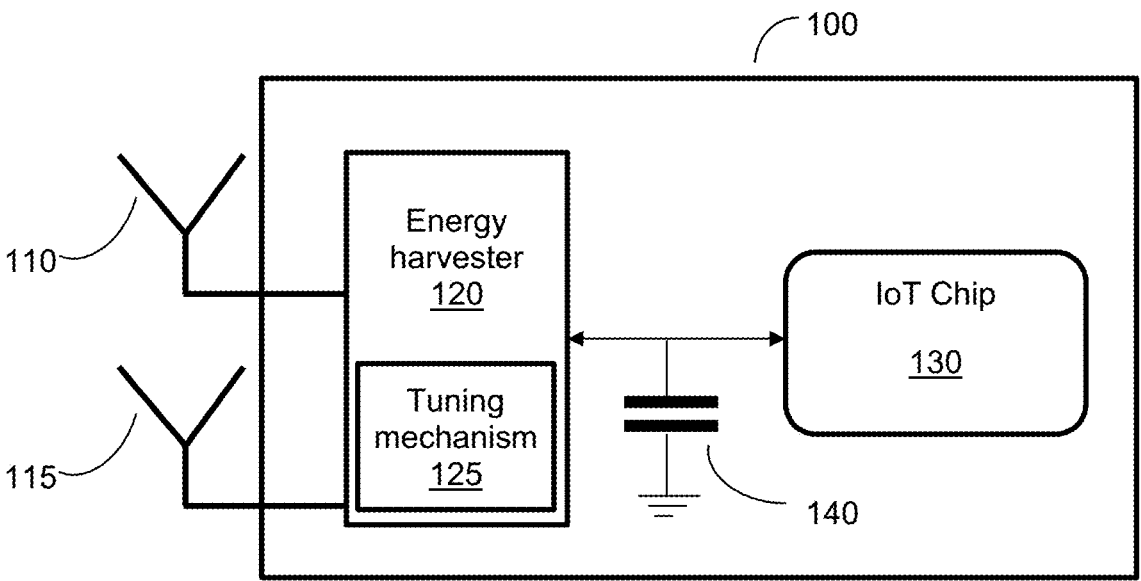
FIG. 1 is a block diagram depicting a power harvesting system configured to provide power to an Internet of Things (IoT) device utilized to describe the various disclosed embodiments.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The various disclosed embodiments include a system and method for measuring the radiation pattern of a harvesting antenna while overcoming the above-noted challenges. The proposed solution allows for the characterization of a radiation pattern of a harvester antenna integrated with a harvester operating based on the incident energy's availability. The radiation pattern measurements are derived when the Device Under Test (DUT) does not provide an explicit signal identifying the data. The antenna under test is part of an IoT tag. A radiation pattern of an antenna describes how the antenna radiates power in various directions. It provides a quantitative measure of the power radiated or received in different directions. The radiation pattern is usually represented graphically as a function of the angular position around the antenna.

According to the disclosed embodiment, the radiation pattern of the harvester antenna is derived from the transmission rate of the IoT tag when powered by the harvested energy. The transmission rate is a function of the incident power level at the harvester antenna. The system setup for measuring the radiation pattern is discussed below.

FIG. 1 is an example block diagram depicting a power harvesting system configured to provide power to an Internet of Things (IoT) tag 100 utilized to describe the various disclosed embodiments. The configuration depicted in FIG. 1 includes a harvester antenna 110, a radio antenna 115, an energy harvester 120, an IoT Integrated Circuit (IC) or simply chip 130, a capacitor 140, and a tuning mechanism 125. In an embodiment, combinations of antennas 110, 115, energy harvester 120, and IoT chip 130 may be configured to include one or more of each device type, enabling configurations including alternate combinations and configurations.

The harvester antenna 110 may be a loop antenna configured to harvest energy from ambient electromagnetic (EM) sources. The antenna 110 may be configured for harvesting energies at different frequency bands. Examples of such frequency bands include the BLE band (2.400-2.4835 GHz), the Wi-Fi 2.4 GHz band, a cellular band (1.7-2 GHz), an FM radio band, an Industrial, Scientific, and Medical (ISM) band (2.4 GHz), a Sub-1 GHz, and the like. In an embodiment, signals are transmitted from the IoT chip 130 over the BLE band. In some configurations, there are multiple harvester antennas 110, each of which is operable at a different domain. Alternatively, the harvester antenna 110 may be tuned to receive radio signals at different bands.

The radio antenna 115 is designed to transmit data from the IoT chip 130 at a frequency band associated with a low-power communication protocol, such as the BLE, but not limited to it. In such a configuration, the operation frequency band of the antenna 115 is 2.400 GHz-2.4835 GHz. In some configurations, a single antenna is used to harvest and transmit data.

The energy harvester 120 may be a component or assembly configured to convert power harvested at any harvesting antenna 110 into power usable by the IoT chip 130. The energy harvester 120, in an embodiment, is a multi-band harvester configured with a plurality of band-specific harvesting units (not shown), each respectively coupled to a different antenna.

The tuning mechanism 125 may be utilized to tune the energy harvester 120 to operate at resonance with the frequency of the received harvesting radio signals. In an embodiment, the tuning mechanism 125 is designed to be activated at very low energy levels to initiate the tuning immediately.

The energy harvested by the energy harvester 120 may be stored in energy storage, such as the capacitor 140. The energy harvester 120 may be integrated into the IoT chip 130 (or IoT tag or chip or integrated circuit). Specifically, in an embodiment, the antennas 110 and 115 are fabricated or printed on the same substrate (inlay) that carries the IoT chip 130.

The IoT chip 130 typically receives and transmits wireless signals using a low-energy communication protocol, such as, but not limited to, the BLE communication standard. In this configuration, one of the antennas 110 may be configured to serve as the transmit/receive antenna of the IoT chip 130.

The IoT chip 130 may be a sensor or other device capable of recording and reporting environmental conditions; an actuator or other device capable of causing a change in a separately connected device or an aspect of the IoT chip's 130 environments; or a multi-function device, capable of both recording and influencing aspects of the device's environment.

The harvester antenna 110 and radio antenna 115 are electrically connected to the energy harvester 120 and, thus, to the chip hosting the IoT chip 130. To reduce mismatch losses and increase the sensitivity of harvesting, each of the antennas 110 or 115 is matched to the IoT device's interface. Since such an interface presents capacitive and/or inductive impedance, the harvester antenna 110 can be designed as a small loop antenna to meet the size requirements of a small form factor IoT chip 130. Further, the design of the harvester antenna 110 is used to impedance match the IoT chip 130 and to impedance match the radio antenna 115. It should be mentioned that the package of an IoT tag, including the structure shown in FIG. 1, is about the size of a U.S. quarter coin.

In an embodiment, the IoT chip 130 may include an oscillator calibration circuit (not shown) configured to calibrate oscillator clocks based on over-the-air reference signals. The oscillator calibration circuit may include a signal frequency detector for producing a reference signal from a received over-the-air signal and detecting a frequency of the over-the-air signal, and at least one locking circuit (FLC) coupled to the signal frequency detector and to an oscillator. The FLC calibrates the frequency of the oscillator using the reference signal to a radio frequency (RF) carrier frequency, and the reference signal is utilized for calibrating the oscillator's clock based on the frequency of the detected over-the-air signal.

In an embodiment, the FLC can be utilized to space between the transmission frequency of the IoT chip 130 and the harvester frequency (which requires generating the radiation pattern of the harvester antenna). To this end, the clock calibration can be utilized to space between the transmission frequency and the harvester frequency. To this end, as the calibration process performed by the FLC searches a certain portion of BLE channel frequencies (e.g., channels 37, 38, 39), the IoT chip 130 transmits in relation to those channels. In the test mode where the radiation pattern is tested, the IoT chip 130 can be configured to transmit the same portion of BLE channel frequencies but at a different frequency to shift the resulting transmitted frequency as desired.

Figure 2:
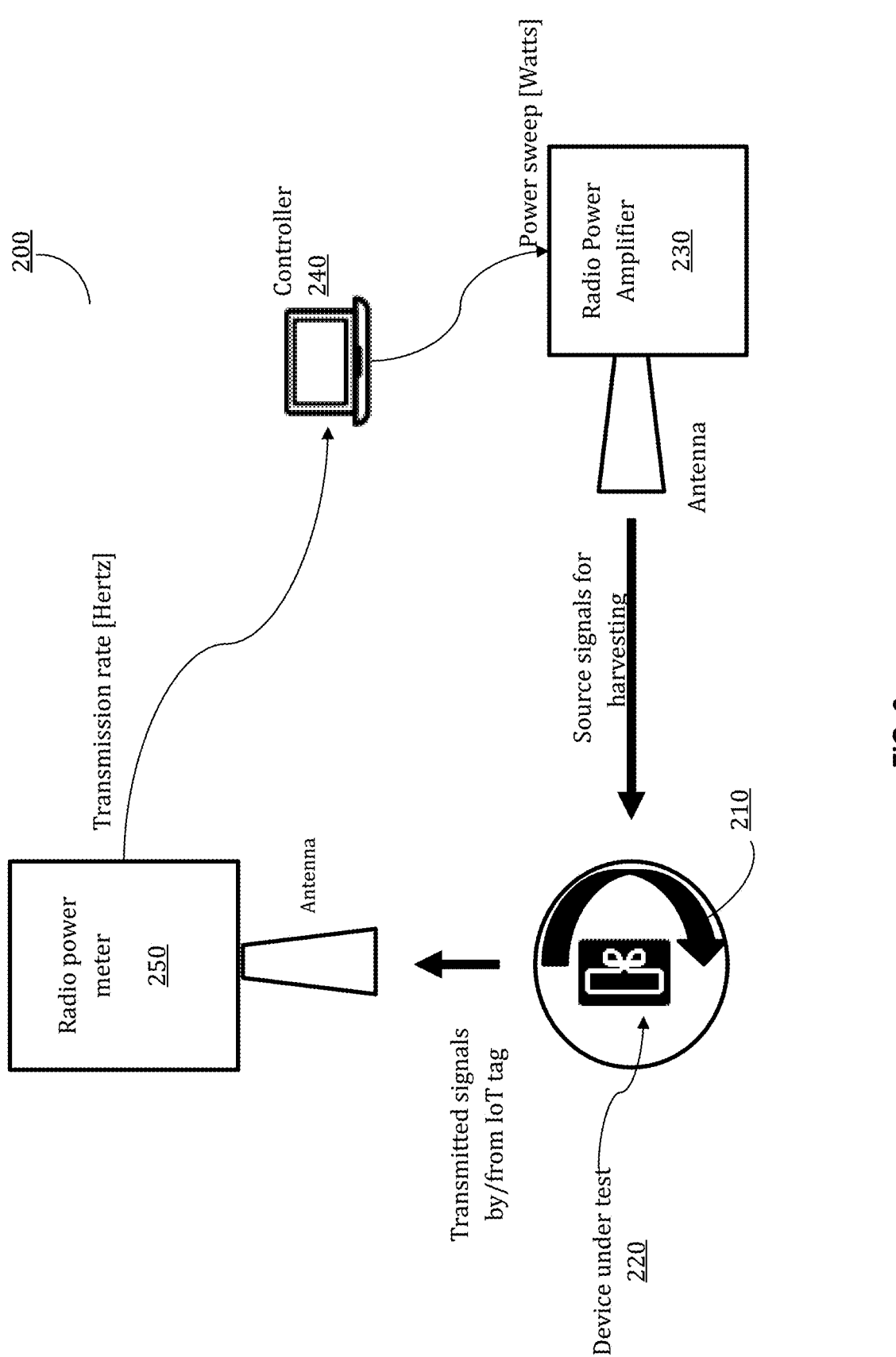
FIG. 2 is a diagram of a system for measuring the radiation pattern of a harvester antenna according to an embodiment.

FIG. 2 shows an example diagram of a measurement system 200 for measuring a radiation pattern of harvester antennas integrated into an IoT tag according to an embodiment. System 200 includes a rotatable surface 210 on which the device under test (DUT) is placed. Here, the DUT is an IoT tag 220, including a harvester antenna (not shown in FIG. 2) to be tested.

System 200 also includes a radio power amplifier 230 configured by a controller 240 to transmit radio signals at different power levels, but at a certain frequency band, that the harvester antenna under test is configured to receive. For example, the harvester antenna is a BLE antenna, and the frequency of signals transmitted by the radio power amplifier 230 may include a 2.4 GHz Industrial, Scientific, and Medical (ISM) band.

System 200 also includes a radio power meter 250 to measure signals transmitted by the IoT tag. The radio power meter 250 is also configured to measure the transmission rate of signals transmitted by the IoT tag. The transmission rate is proportional to the power of the signal at the input of the harvester antenna. As noted above, in some configurations, the transmit antenna of the IoT tag is different than the harvester antenna. The transmission rate measured by the radio power meter 250 is sent to controller 240. The radio power meter 250 may be replaced by a spectrum analyzer or any other device that can measure the transmission rate.

The controller 240 may be any computing device configured to produce a radiation pattern based on the power level of a signal transmitted by the radio power amplifier 230 and a transmission rate measured by the radio power meter 250. In one embodiment, controller 240 associates the harvesting signal power level per direction with the resulted/measured transmission rate.

The antenna pattern is derived from the source power (signal provided by the amplifier 230) required to reach a particular transmission rate per direction. Such transmission rate may be preconfigured to a certain threshold. The harvester antenna frequency response is derived from the additive inverse energy source's change in the power level needed to bring the DUT to a particular transmission rate at each point (frequency) over the measured frequencies. The DUT is the IoT tag, including the harvester antenna from which the radiation pattern is measured.

Controller 240 is configured to compute the source power required to reach the particular transmission rate at each point over the measured frequencies per source power signal frequency. To this end, controller 240 is configured to measure the harvesting signal power level, which yields a certain (pre-configured) transmission rate. That is, the incident power (Pr) the harvester antenna is measured. Typically, an antenna designer designs an antenna with specific antenna performances:

Gant, antenna gain;

R rad, antenna radiation resistance;

Q, function of all resistances; and

Lant, the inductance that the antenna presents at its ports.

In the configuration of a harvesting antenna in the form factor discussed above, the measurements of these specific antenna performances cannot be directly accessible at the lab. Thus, according to an embodiment, the antenna performances are derived from a system-level measurement of incident power Pr which is a function of the tag transmission rate Ftx. That is, the transmission rate depends on the incident power Ftx(Pr) harvester antenna is a receive antenna, where Pin is the power level received at the antenna. To generate a radiation pattern of the antenna, Pin can be represented as a function of Pr at a targeted transmission rate $Ftx_t$ That is, Pin is a function of the inverse plot $Pr[Ftx_t]$ where $Ftx_t$ is a target value. In an embodiment, Pr is derived from the Friis equation, assuming an isotropic ideal antenna at the tag location (G=1).

In an embodiment, controller 240 is configured to perform the following process to measure the antenna radiation pattern:

a) sweeping the power level of a source signal for the harvester of an IoT tag and receiving the transmission rate as provided by the power meter;

b) for each direction, the power level $Pr[Ftx_t]$ is registered as Pr(direction);

c) the maximal antenna gain P min is set at the minimum levels of Pr(direction) among the tested directions; and d) each direction is normalized as follows:

$$Ds[dBi] = \log\left(\frac{P\text{min}}{P(\text{direction})}\right),$$

where Ds is directivity. Equ. 1

It should be noted that the radiation pattern in the tag may represent the radiation pattern of the entire harvest system.

Figure 3:
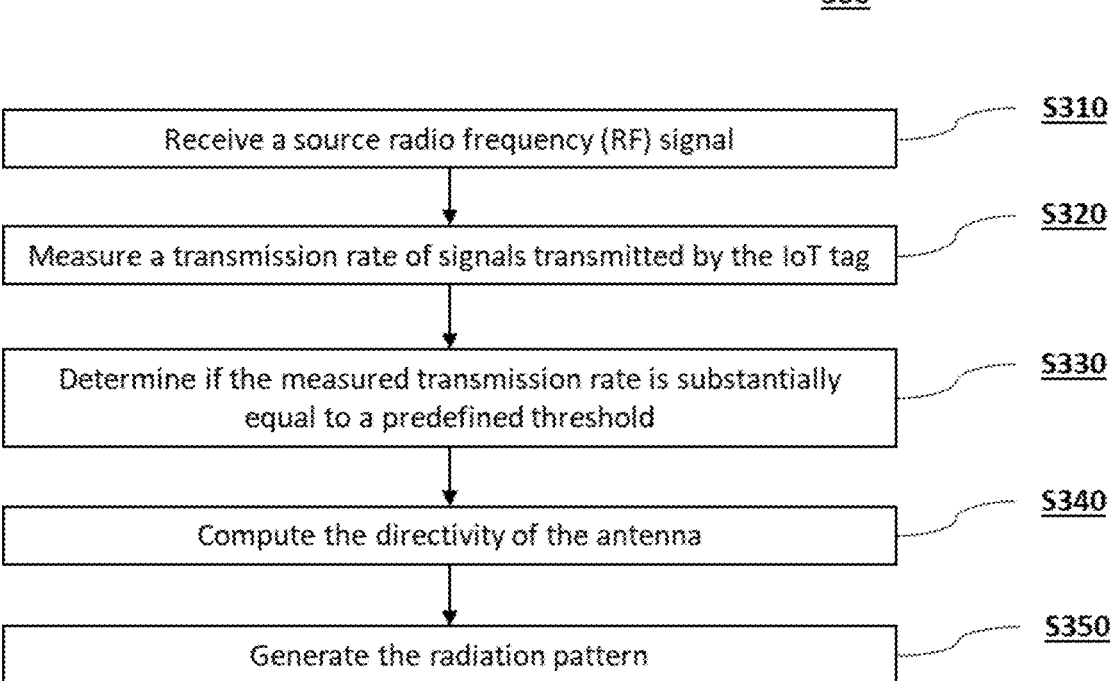
FIG. 3 is a flowchart of an example method for measuring an antenna radiation pattern of a harvester antenna printed on a substrate of an Internet of Things (IoT) tag according to an embodiment.

FIG. 3 is an example flowchart of a method 300 for measuring an antenna radiation pattern of a harvester antenna printed on a substrate of an Internet of Things (IoT) tag according to an embodiment. In some implementations, one or more process blocks of FIG. 3 may be performed by the controller 240.

As shown in FIG. 3, method 300 may include sweeping a power level of a source radio frequency (RF) signal transmitted at a particular direction (S310). The sweeping of the power level is over a predefined range of power levels. In an embodiment, the source RF signal is transmitted in a particular direction and received by the harvester antenna.

At S320, the transmission rate of signals transmitted by the IoT tag is measured. The transmission rate is proportional to the power level of a source RF signal received by the harvester antenna.

At S330, it is determined if the measured transmission rate is substantially equal to a predefined threshold. For example, controller 240 may determine if the measured transmission rate is substantially equal to $Ftx_t$, as described above. In an embodiment, S330 includes registering, for each direction, the transmitted power level where $Ftx_t$ is reached. This value may be registered or saved as Pr(direction). The steps S310 through S330 are repeated in each direction for which the radiation pattern is required.

At S340, the directivity of the antenna is computed. In an embodiment, the directivity of the antenna is computed using the equation (Equ. 1) above. At the end of the method, a plot of the measured radiation pattern is output.

Figure 4:
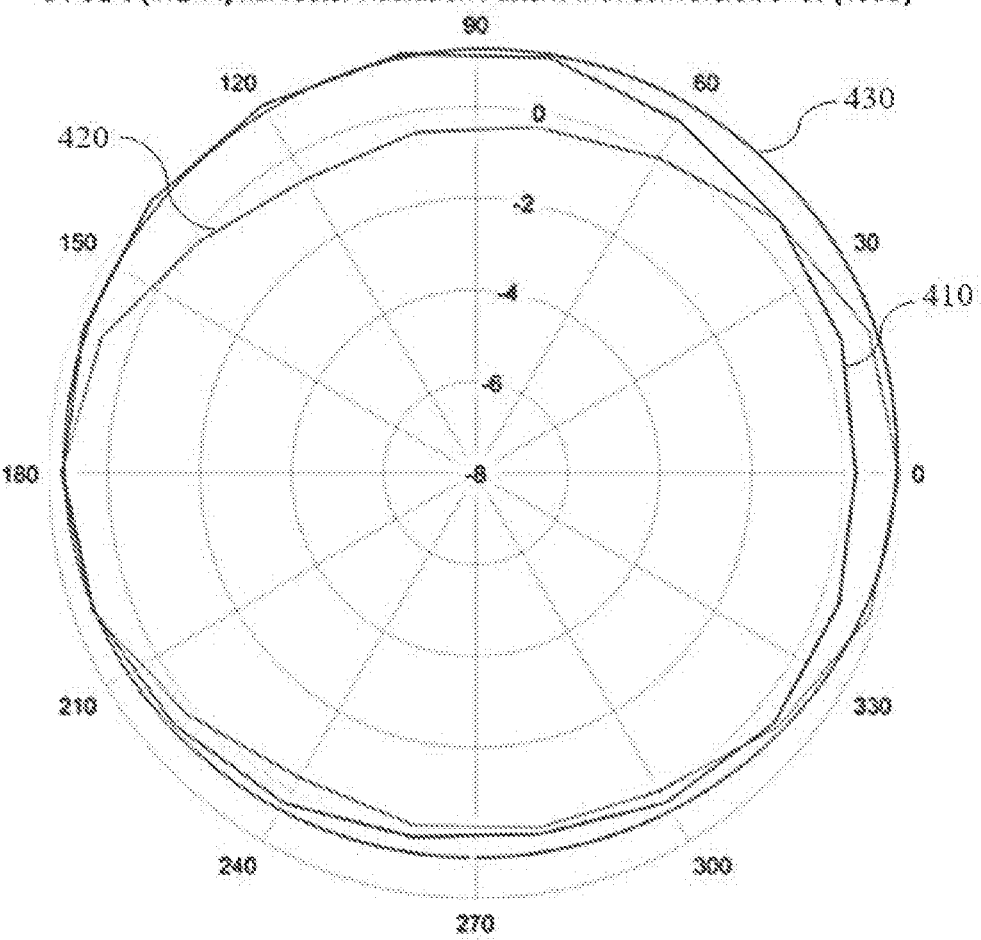
FIG. 4 is a radiation pattern diagram depicting the radiation pattern of a harvester antenna measured according to the disclosed embodiments.

At S350, a radiation pattern is generated for a harvester antenna. An example radiation pattern generated, according to the disclosed embodiments, is shown in FIG. 4. It should be noted that the values can be generated or presented in other formats, such as tables, arrays, and so on.

FIG. 4 shows measurements in a big chamber 410 (which is a 5-meter anechoic) with a high-quality setup; in a small chamber 420 (which is a compact low-quality 2-meter chamber), and simulation results 430.

Although FIG. 3 shows example blocks of process 300, in some implementations, process 300 may include additional blocks, fewer blocks, different blocks, or differently arranged blocks than those depicted in FIG. 3. Additionally, or alternatively, two or more of the blocks of process 300 may be performed in parallel.

In an embodiment, the frequency response and sensitivity of the harvester can be measured using system 200. In this embodiment, controller 240 does not sweep the power levels of a source signal transmitted by the radio power amplifier 230 but instead sweeps the source signal's frequency. When measuring the sensitivity, no normalization is performed.

FIG. 5 is flowchart of an example method 500 for measuring the frequency response of a harvester antenna. In some implementations, one or more process blocks of FIG. 5 may be performed by controller 240.

S510 includes sweeping the frequency of a source radio frequency (RF) signal. The sweep is performed over a predefined range of frequencies. The signals transmitted by the power radio amplifier are received at the harvester antenna.

At S520, the transmission rate of signals transmitted by the IoT tag is measured. The transmission rate is proportional to the power of a source RF signal received by the harvester antenna.

At S530, it is determined if the measured transmission rate is substantially equal to a predefined frequency response threshold. If not, the power level of the source RF signal is adjusted until the transmission rate is substantially equal to the predefined threshold.

Figure 6:
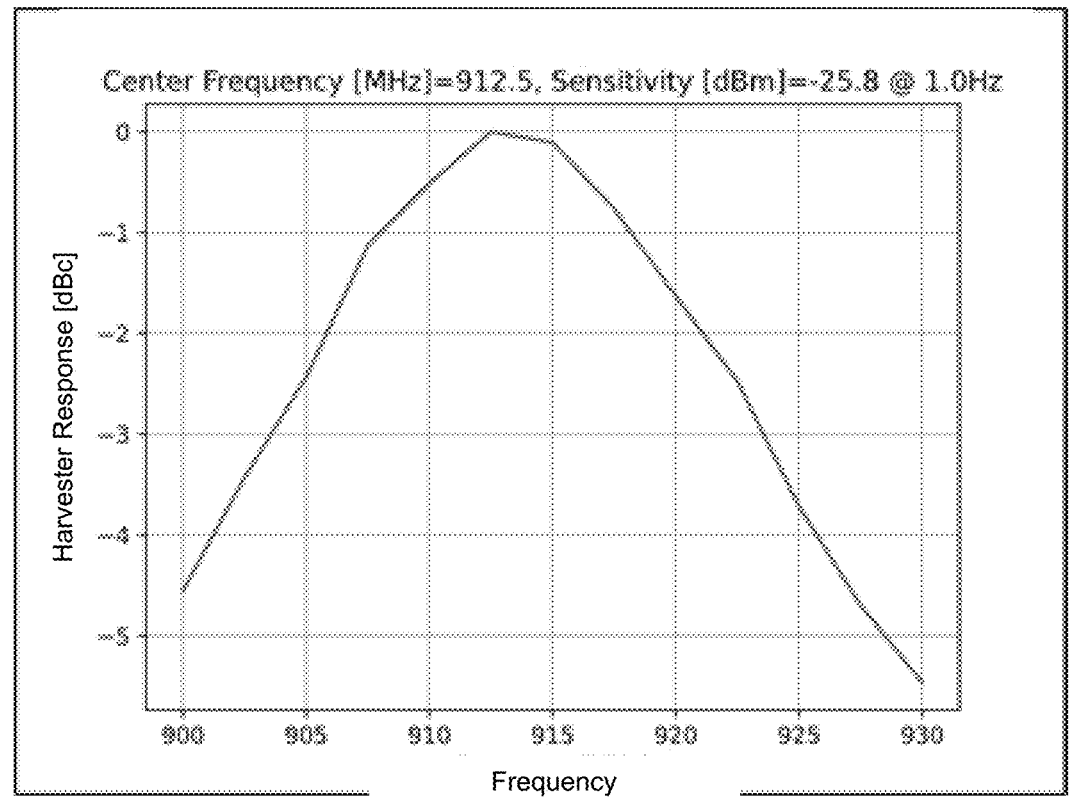
FIG. 6 shows a harvester frequency response measured according to the disclosed embodiments.

At S540, the frequency response at each frequency is measured based on the power level that allows the harvester to harvest enough power to transmit signals at a transmission rate higher than the predefined threshold. At S550, a plot of the measured frequency response is output. An example chart showing the measured sensitivity of a harvester according to an embodiment is shown in FIG. 6. It should be noted that the values can be generated or presented in other formats, such as tables, arrays, and so on.

It should be noted that although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

Figure 7:
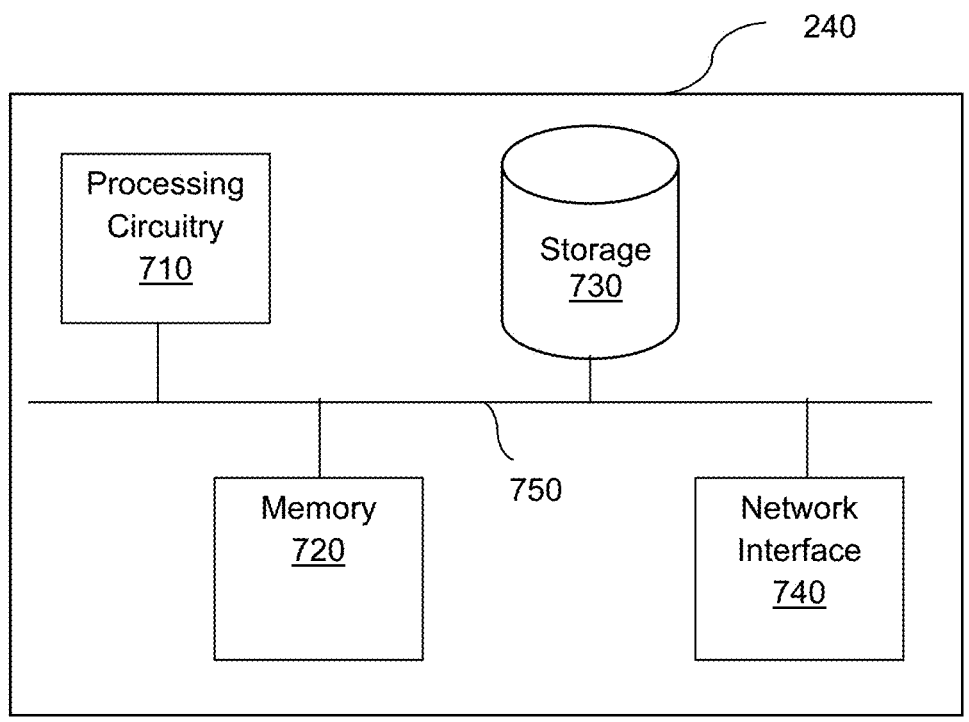
FIG. 7 is a block diagram of a controller.

FIG. 7 shows an example block diagram of the controller 240 according to an embodiment. Controller 240 includes processing circuitry 710 coupled to a memory 720, a storage 730, and an interface 740. In an embodiment, the components of controller 240 may be communicatively connected via a bus 750.

The processing circuitry 710 may be realized as one or more hardware logic components and circuits. For example, and without limitation, illustrative types of hardware logic components that can be used include field programmable gate arrays (FPGAs), application-specific integrated circuits (ASICs), Application-specific standard products (ASSPs), system-on-a-chip systems (SOCs), graphics processing units (GPUs), tensor processing units (TPUs), general-purpose microprocessors, microcontrollers, digital signal processors (DSPs), and the like, or any other hardware logic components that can perform calculations or other manipulations of information.

Memory 720 may be volatile (e.g., random access memory, etc.), non-volatile (e.g., read-only memory, flash memory, etc.), or a combination thereof.

In one configuration, software for implementing one or more embodiments disclosed herein may be stored in storage 730. In another configuration, memory 720 is configured to store such software. Software shall be construed broadly to mean any type of instructions, whether referred to as software, firmware, middleware, microcode, hardware description language, or otherwise. Instructions may include code (e.g., in source code format, binary code format, executable code format, or any other suitable format of code). The instructions, when executed by processing circuitry 710, cause the processing circuitry 710 to perform the various processes described herein for measuring radiation patterns and sensitivity of harvester antennas.

The storage 730 may be magnetic storage, optical storage, and the like, and may be realized, for example, as flash memory or other memory technology, compact disk-read only memory (CD-ROM), Digital Versatile Disks (DVDs), or any other medium which can be used to store the desired information. The storage may include the measured radiation patterns. Interface 740 allows the controller to communicate with the radio power amplifier and the radio power meter. Interface 740 may also include communicating with a user device (e.g., a PC) to provide plots or charts measured by controller 240. Alternatively, the measurements may be provided to a user device to render such plots or charts.

It should be understood that the embodiments described herein are not limited to the specific architecture illustrated in FIG. 7, and other architectures may be equally used without departing from the scope of the disclosed embodiments.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

The various embodiments disclosed herein can be implemented as hardware, firmware, software, or any combination thereof. Moreover, the software is preferably implemented as an application program tangibly embodied on a program storage unit or computer-readable medium consisting of parts, or of certain devices and/or a combination of devices. The application program may be uploaded to, and executed by, a machine comprising any suitable architecture. Preferably, the machine is implemented on a computer platform having hardware such as one or more central processing units (CPUs), memory, and input/output interfaces.

The computer platform may also include an operating system and microinstruction code. The various processes and functions described herein may be either part of the microinstruction code or part of the application program or any combination thereof, which may be executed by a CPU, whether or not such a computer or processor is explicitly shown. In addition, various other peripheral units may be connected to the computer platform, such as an additional data storage unit and a printing unit. Furthermore, a non-transitory computer-readable medium is any computer-readable medium except for a transitory propagating signal.

All examples and conditional language recited herein are intended for pedagogical purposes to aid the reader in understanding the principles of the disclosed embodiment and the concepts contributed by the inventor to further the art and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

It should be understood that any reference to an element herein using a designation such as "first," "second," and so forth does not generally limit the quantity or order of those elements. Rather, these designations are generally used as a convenient method of distinguishing between two or more elements or instances of an element. Thus, a reference to the first and second elements does not mean that only two elements may be employed there or that the first element must precede the second element in some manner. Also, unless stated otherwise, a set of elements comprises one or more elements.

As used herein, the phrase "at least one of" followed by a listing of items means that any of the listed items can be utilized individually, or any combination of two or more of the listed items can be utilized. For example, if a system is described as including "at least one of A, B, and C," the system can include A alone, B alone; C alone; 2A; 2B; 2C; 3A; A and B in combination; B and C in combination; A and C in combination; A, B, and C in combination; 2A and C in combination; A, 3B, and 2C in combination; and the like.

What is claimed is:

1. A method for measuring an antenna radiation pattern of a harvester antenna printed on a substrate of an Internet of Things (IoT) tag, comprising:
  sweeping a power level of a source radio frequency (RF) signal transmitted at a particular direction, wherein the source RF signal is received by the harvester antenna;
  measuring a transmission rate of signals transmitted by the IoT tag, wherein the transmission rate is proportional to the power level of a source RF signal received by the harvester antenna;
  determining if the measured transmission rate is substantially equal to a predefined threshold;
  registering, at each measured direction, a power level of a signal reaching a transmission rate is substantially equal to the predefined threshold; and
  plotting the antenna radiation pattern based on the registered power levels.

2. The method of claim 1, further comprising:
  repeating the process for each direction for which the radiation pattern is required.

3. The method of claim 1, wherein the source radio signal is transmitted by a radio power amplifier.

4. The method of claim 3, wherein the transmission rate is measured by any one of: a radio power meter and a spectrum analyzer.

5. The method of claim 4, wherein the method is performed by a controller configured to control the radio power amplifier and the radio power meter.

6. The method of claim 1, further comprising:
  computing, using registered power levels, directivity of the harvester antenna.

7. The method of claim 1, wherein the harvester is printed on the same substrate of the IoT tag.

8. The method of claim 1, wherein a frequency band of the source RF signal is any one of: a BLE band, a Wi-Fi band, a cellular band, an ISM band, a Sub-1 GHz, and an FM radio band.

9. A method for measuring a frequency response of a harvester antenna printed on a substrate of an Internet of Things (IoT) tag, comprising:
  sweeping a frequency of a source radio frequency (RF) signal, wherein the source RF signal is received at the harvester antenna;
  measuring a transmission rate of signals transmitted by the IoT tag, wherein the transmission rate is proportional to a power of a source RF signal received by the harvester antenna;
  determining if the measured transmission rate is substantially equal to a predefined threshold; and
  setting the frequency response based on frequencies that allow the harvester to harvest enough power to transmit signals at the transmission rate that is substantially equal to the predefined threshold.

10. The method of claim 9, further comprising:
  adjusting a power level of the source RF signal until the measured transmission rate is substantially equal to the predefined threshold.

11. A system for measuring an antenna radiation pattern of a harvester antenna, printed on a substrate of an Internet of Things (IoT) tag, comprising:
  a radio power amplifier configured to transmit source radio frequency (RF) signals at various directions, wherein the transmitted source RF signals are received by the harvester antenna, wherein the harvester antenna of an IoT tag is a device under test (DUT);
  a radio power meter for receiving signals transmitted by the IoT tag, and
  a controller configured to control the radio power amplifier and the radio power meter, wherein the controller is further configured to:
  sweep a power level of a source radio frequency (RF) signal transmitted at a particular direction, wherein the source RF signal is received by the harvester antenna;
  measure a transmission rate of signals transmitted by the IoT tag, wherein the transmission rate is proportional to the power level of a source RF signal received by the harvester antenna;
  determine if the measured transmission rate is substantially equal to a predefined threshold;
  register, at each measured direction, a power level of a signal reaching a transmission rate is substantially equal to the predefined threshold; and
  plot the antenna radiation pattern based on the registered power levels.

12. The system of claim 11, wherein the controller is configured to:
  repeat the process for each direction for which the radiation pattern is required.

13. The system of claim 11, wherein the controller is configured to:
  compute, using registered power levels, directivity of the harvester antenna.

14. A system for a frequency response of a harvester antenna printed on a substrate of an Internet of Things (IoT) tag, comprising:
  a radio power amplifier configured to transmit source radio frequency (RF) signals at various directions, wherein the transmitted source RF signals are received by the harvester antenna, wherein the harvester antenna of an IoT tag is a device under test (DUT);
  a radio power meter for receiving signals transmitted by the IoT tag, and
  a controller configured to control the radio power amplifier and the radio power meter, wherein the controller is further configured to:
  sweep a frequency of a source radio frequency (RF) signal, wherein the source RF signal is received at the harvester antenna;
  measure a transmission rate of signals transmitted by the IoT tag, wherein the transmission rate is proportional to a power of a source RF signal received by the harvester antenna;
  determine if the measured transmission rate is substantially equal to a predefined threshold;
  set the frequency response based on frequencies that allow the harvester to harvest enough power to transmit signals at the transmission rate that is substantially equal to the predefined threshold.

15. The system of claim 14, wherein the controller is further configured to:
  adjust a power level of the source RF signal until the measured transmission rate is substantially equal to the predefined threshold.

16. The method of claim 2, wherein the method is implemented using a system comprising:

a radio power amplifier configured to transmit source radio frequency (RF) signals at various directions, wherein the transmitted source RF signals are received by the harvester antenna, wherein the harvester antenna of an IoT tag is a device under test (DUT);

a radio power meter for receiving signals transmitted by the IoT tag, and a controller configured to control the radio power amplifier and the radio power meter;

wherein the controller is further configured to perform the method.

17. The method of claim 6, wherein the method is implemented using a system comprising:

a radio power amplifier configured to transmit source radio frequency (RF) signals at various directions, wherein the transmitted source RF signals are received by the harvester antenna, wherein the harvester antenna of an IoT tag is a device under test (DUT);

a radio power meter for receiving signals transmitted by the IoT tag, and a controller configured to control the radio power amplifier and the radio power meter;

wherein the controller is further configured to perform the method.

18. The method of claim 9, wherein the method is implemented using a system comprising:

a radio power amplifier configured to transmit source radio frequency (RF) signals at various directions, wherein the transmitted source RF signals are received by the harvester antenna, wherein the harvester antenna of an IoT tag is a device under test (DUT);

a radio power meter for receiving signals transmitted by the IoT tag, and a controller configured to control the radio power amplifier and the radio power meter;

wherein the controller is further configured to perform the method.

* * * * *